United States Patent [19]

Takemae et al.

[11] Patent Number: 4,819,209
[45] Date of Patent: Apr. 4, 1989

[54] SIMULTANEOUS DUAL ACCESS SEMICONDUCTOR MEMORY DEVICE

[75] Inventors: Yoshihiro Takemae, Tokyo; Takashi Horii, Yokohama, both of Japan

[73] Assignee: Fujitsu Limited, Kawasaki, Japan

[21] Appl. No.: 63,989

[22] Filed: Jun. 19, 1987

[30] Foreign Application Priority Data

Jun. 19, 1986 [JP] Japan ................. 61-143532

[51] Int. Cl.[4] .......... G11C 8/00; G11C 7/00; G11C 5/02
[52] U.S. Cl. ................... 365/230; 365/51; 365/189; 365/222
[58] Field of Search .......... 365/189, 230, 51, 222, 365/63, 72

[56] References Cited

U.S. PATENT DOCUMENTS

| | | | |
|---|---|---|---|
| 4,742,493 | 5/1988 | LeWallen et al. | 365/230 X |
| 4,758,988 | 7/1988 | Kuo | 365/189 X |
| 4,758,993 | 7/1988 | Takemae | 365/222 X |

FOREIGN PATENT DOCUMENTS 0120485 10/1984 European Pat. Off. ............ 365/230

Primary Examiner—Stuart N. Hecker
Assistant Examiner—Alfonso Garcia
Attorney, Agent, or Firm—Staas & Halsey

[57] ABSTRACT

A semiconductor memory device includes: a memory cell array constituted of a plurality of memory cell array units; transfer gates inserted in bit lines between the adjacent memory cell array units; a first and a second column decoders connected to both ends of bit lines in which the transfer gates are inserted; a row decoder connected to word lines of the memory cell array. The row decoder is adapted to be divided selectively in two parts; and two sets of row/column addresses are supplied to the column decoders and the row decoder. Therefore, simultaneous separate accesses to the memory cell array are carried out by the two sets of row/column addresses.

8 Claims, 13 Drawing Sheets

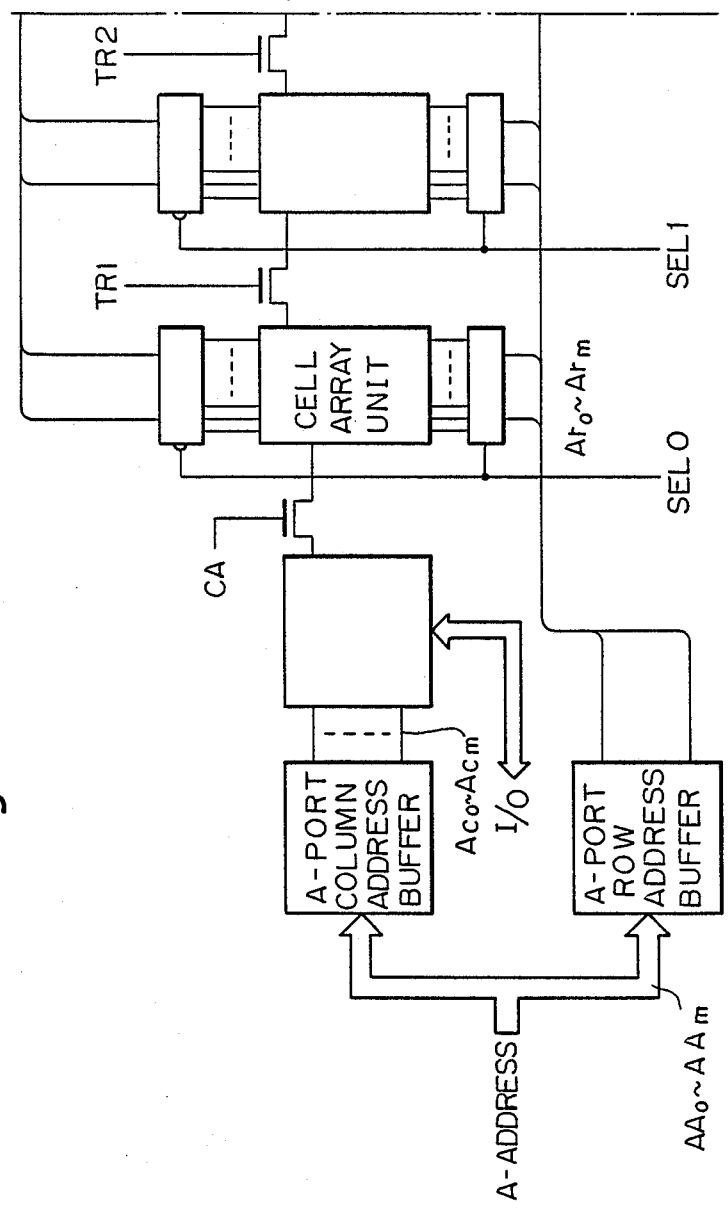

Fig. 10

LOGIC TABLE FOR SELECTION OF TRANSFER GATE AND DECODER

| A/B̄ | $r_m$ | $r_{m-1}$ | $TR_1$ | $TR_2$ | $TR_3$ | $SEL_0$ | $SEL_1$ | $SEL_2$ | $SEL_3$ |
|---|---|---|---|---|---|---|---|---|---|
| H | L | L | L | H | H | H | L | L | L |
| H | L | H | H | L | H | H | H | L | L |
| H | H | L | H | H | L | H | H | H | L |
| H | H | H | H | H | H | H | H | H | H |
| L | L | L | H | H | H | L | L | L | L |
| L | L | H | L | H | H | H | L | L | L |
| L | H | L | H | L | H | H | H | L | L |
| L | H | H | L | H | L | H | H | H | L |

SIMULTANEOUS DUAL ACCESS SEMICONDUCTOR MEMORY DEVICE

BACKGROUND OF THE INVENTION

1. Field of the Invention

The present invention relates to a semiconductor memory device. The device according to the present invention is used in the case where a simultaneous access by two sets of row/column addresses and a transfer of stored data between a pair of cell array units are carried out.

2. Description of the Related Arts

Today's semiconductor memory devices have an enormous capacity and are now used in many fields.

In general, a semiconductor memory device is comprised of a plurality of word lines and bit lines, a row decoder and a column decoder, both of which select word lines and bit lines, and a data bus (input/output port). That is, a one-cell-array-to-one-input/output-port structure is adopted.

Another modification is that a shift register is arranged in parallel with, for example, a DRAM (dynamic random access memory) cell array. In this memory device, data is transferred in parallel between the cell array and a shift register, a unit of n bits of data is input or output at an input/output port through said shift register, where the number of memory cells which belongs to one word line is N. On the other hand, a unit of one bit and the like of data is input or output at an input/output port at the side of a DRAM cell array.

A further modification is that two central processing units which have a common RAM are provided. In this case, the RAM should be accessable simultaneously and independently from the two input/output ports. Such a dual port RAM is realized by using a static random access memory (SRAM) device. That is, this dual port type RAM is provided with two sets of word lines and bit lines in a duplicate manner with respect to an SRAM cell array, and a word decoder and a column decoder is provided with each set, thus enabling a simultaneous and independent memory access.

It is difficult, however, for a dual port type SRAM to provide a cell array with duplicate word lines, bit lines, a word decoder, a column decoder, and the like. On the other hand, in the memory of a cell array plus shift register type DRAM, an access from the shift register side is composed of a unit of words and is not composed of a bit unit of a random access memory.

SUMMARY OF THE INVENTION

It is an object of the present invention to provide a semiconductor memory device wherein a cell array can be divided dynamically through transfer gates and said device can carry out a simultaneous and independent access.

In accordance with the present invention, there is provided a semiconductor memory device including: a memory cell array constituted by a plurality of memory cell array units; transfer gates inserted in bit lines between the adjacent memory cell array units; a first and a second column decoders connected to both ends of bit lines in which said transfer gates are inserted; and a row decoder connected to word lines of said memory cell array; said row decoder being adapted to be divided operatively in two; two sets of row/column addresses being supplied to said column decoders and said row decoder; whereby simultaneous separate accesses to said memory cell array are carried out by said two sets of row/column addresses.

In accordance of another feature of the present invention, there is provided a semiconductor memory device including: a memory cell array constituted by plurality of memory cell array units; transfer gates inserted in bit lines between the adjacent memory cell array units; a first and a second column decoders connected to both ends of bit lines in which the transfer gates are inserted; a row decoder connected to word lines of the memory cell arrays; the row decoder being adapted to be divided selectively into two parts; a first-port and a second-port row address buffers for inputting a first port and a second port input addresses, respectively; a first-port and a second-port column address buffer for delivering a separate column latch address; wherein there is provided arbitrary terminals in which, when the first port and said second port access the same memory cell array unit separately, either of the two ports can be operated to arrange according to priority.

In accordance of still another feature of the present invention, there is provided a semiconductor memory device including: a memory cell array constituted by an even number of plural memory cell array units; transfer gates inserted in bit lines between the adjacent memory cell array units; a first and a second column decoders connected to both ends of bit lines in which the transfer gates are inserted, both column decoders being input by column addresses from both ends; and a row decoder connected to word lines of the memory cell array, the row decoder being input by row addresses from both ends and the row decoder being adapted to be partitioned selectively into two parts; wherein it is a respective nearest array unit to each port from both ends that the two ports can make a direct access and array units other than the nearest array units can be served as a stack.

BRIEF DESCRIPTION OF THE DRAWINGS

FIGS. 8 and 8A–B are block diagrams showing the A and B address, the row and column address buffers;

FIG. 10 is a logic table for selection of transfer gates and decoders;

DESCRIPTION OF THE PREFERRED EMBODIMENTS

Before the description of the preferred embodiments, a prior art semiconductor memory device for use in simultaneous access is described with reference to FIG. 1.

Figure 1:
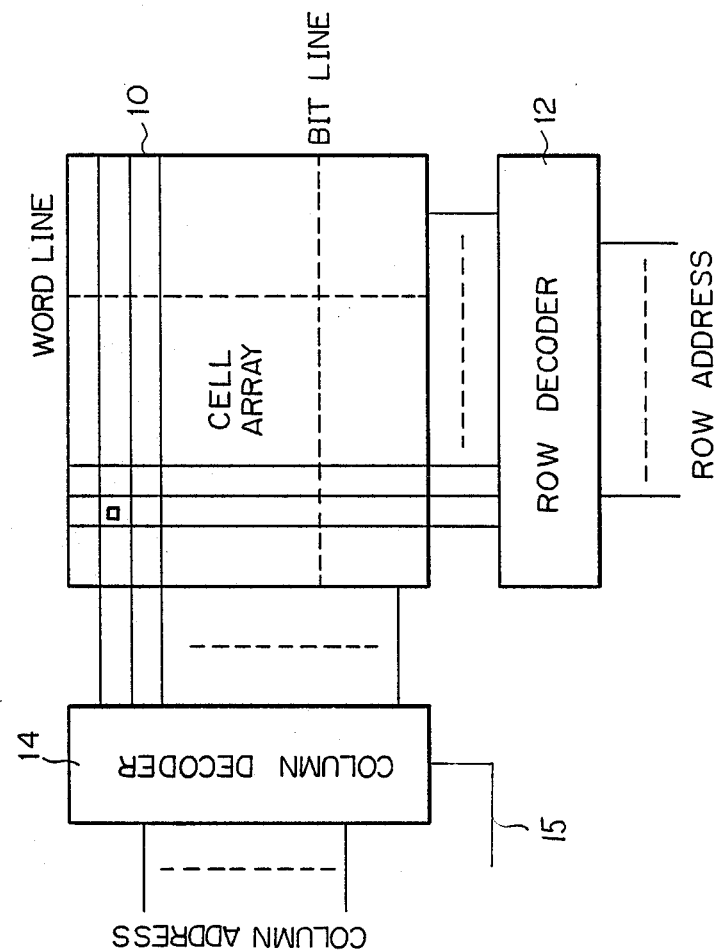
FIG. 1 shows a prior art semiconductor memory device.

FIG. 1 is a block diagram of a conventional multi-access semiconductor memory device, and includes a cell array 10, a row decoder 12, and column decoders 14 for selecting one word line and one bit line from a plurality of word lines WL and a plurality of bit lines BL, and a data bus 15 (input/output port) connected to the column decoder 14. This constitutes a one-cell-array-to-one-input/output-port structure.

Figure 2:
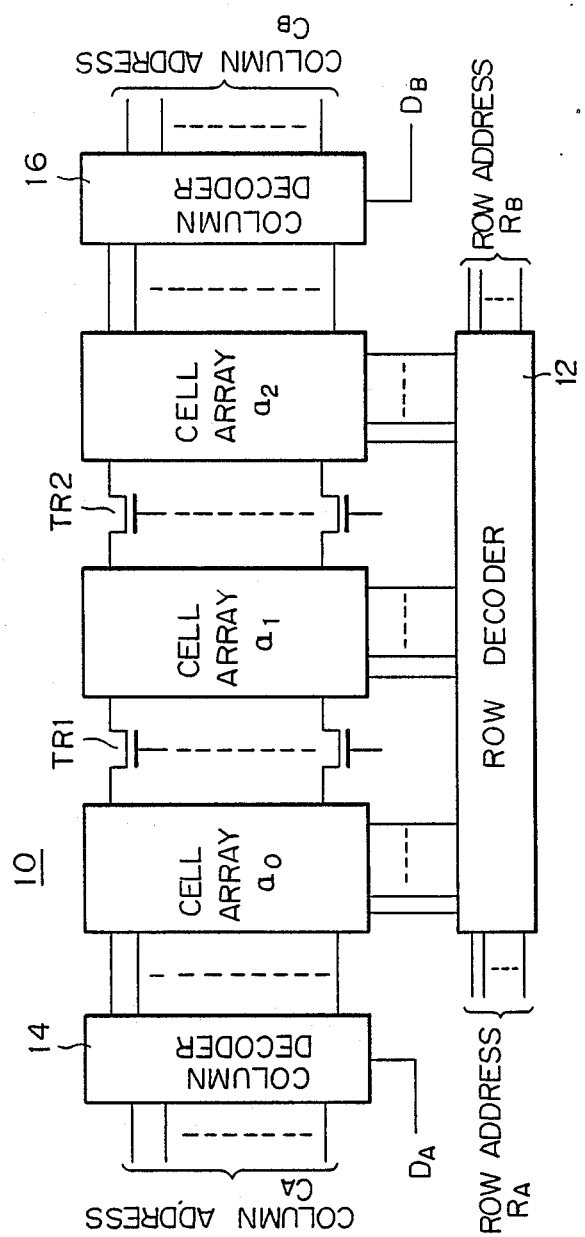
FIG. 2 is a block diagram showing a semiconductor memory device for multi-access according to the present invention.

FIG. 2 is a block diagram showing the present invention.

The cell array is divided into three units, $a_0$, $a_1$, and $a_2$, which is often used to divide the cell array into a plurality of cell array units. Bit lines between each memory to the adjacent cell array units, respectively, cell array units $a_0$, $a_1$, and $a_2$ are connected through transfer gates $TR_1$ and $TR_2$, and word lines of each cell array unit $a_0$, $a_1$, $a_2$ are all connected to a row decoder 12. Both ends of bit lines connected through transfer gates are connected to a pair of column decoders 14, 16, and data buses $D_A$ and $D_B$ extended from these column decoders. Therefore, the input/output port is composed of the data buses $D_A$ and $D_B$.

First, if a memory cell array is divided dynamically by transfer gates $TR_1$ and $TR_2$, the memory cell is composed of two memories which can be accessed simultaneously and independently from two locations. For example, if the transfer gate $TR_1$ is turned OFF and the transfer gate $TR_2$ turned ON, one memory is formed by a cell array unit $a_0$, a row decoder 12, and a column decoder 14, and another memory is formed by cell array units $a_1$ and $a_2$, a row decoder 12, and a column decoder 16. Thus, these two memories can be simultaneously and independently accessed by both a row address $R_A$ and a column address $C_A$ and a row address $R_B$ and a column address $C_B$. Moreover, since the row decoder 12 is dynamically divided into two parts, two word lines can be simultaneously and independently accessed in response to the row addresses $R_A$ and $R_B$ Second, if a transfer gate $TR_1$ is turned ON, and a transfer gate $TR_2$ is turned OFF, cell array units $a_0$ and $a_1$ become a first memory and a cell array $a_2$ become a second memory, and thus two memories are realized.

Third, if both transfer gates $TR_1$ and $TR_2$ are turned OFF, a first memory of the cell array unit $a_0$ and a second memory of the cell array unit $a_2$ are realized, but the cell array $a_1$ cannot be a directly accessed.

When a selective cell exists in the area of both cell array units $a_0$ and $a_1$ the above-mentioned first type of memory can be adopted, and when a selective cell exists in the area of both cell array units $a_0$ and $a_2$, the above-mentioned third type of memory can be adopted This also applies in the following cases.

When one of the selective cells exists in the area of a cell array unit $a_1$, the above-mentioned first or second type of memory must be adopted. In this case, the data for reading the cell enters the following cell array unit through a transfer gate and is output from the data bus through a column decoder. Each cell array unit includes a respective sense amplifier, which starts to run in sequence.

There are many types of disposal layouts for the sense amplifier, and therefore, for brevity word lines which include selective cells for a cell array unit al are selected, and a potential difference is applied to each bit line, based upon the data of all memory cells which belong to the word lines, thus making the sense amplifier of the cell array unit a active to enhance the potential difference. Then, when the transfer gate $TR_2$ (in case of the first memory) or the transfer gate $TR_1$ (in case of the second memory) is turned ON, a potential difference is applied to the bit lines of a cell array unit $a_2$ or $a_0$, thus making the sense amplifier of the cell array unit $a_2$ or $a_0$ active, to enhance the potential difference. Therefore, because of the sequential operation, it is concluded that one of the potential differences, which is determined by the column address $C_B$ or $C_A$ through the column decoder 16 or 14, is output via the data bus $D_B$ or $D_A$.

Therefore, the read-out time slightly increases more by the first type or the second type memory. But a memory having a large capacity can carry out a bit line division for the improvement of the so-called C-ratio which is the ratio of the capacity per one cell versus the capacity of a word line, and therefore this point becomes unimportant.

The above-mentioned third type of memory can be dealt by the same sensibility as that for where there are two memories in a chip. An access time is the same as in a conventional one chip-one-cell array-type memory. Moreover, with regard to the third type memory, the intermediate cell array other than the both ends (in this example, $a_1$) can be utilized as a buffer for saving data or a stack. That is, an access from a CPU is carried out for the cell array units $a_0$ or $a_2$ at both ends. When a temporary stop is required in the calling of the data at a cell array unit $a_0$ ($D_0$) and data other than $D_0$, that is, $D_3$ are processed, such usage is made possible by transferring the data $D_0$ at the cell array unit $a_0$ to the cell array unit $a_1$ and loading the data $D_3$ to the cell array unit $a_0$. Then, when the data $D_0$ is to be processed again, the data $D_3$ is purged and then the data is transferred from the cell array unit $a_1$ to the cell array unit $a_0$.

In order to transfer data at the cell array unit $a_0$ to the cell array unit $a_1$, the following operation sequence is run, that is:

the potential at word lines of the cell array unit $a_0$ is raised;

the potential difference is applied to all bit lines by the data stored in the memory cell which belongs to the above-noted word lines;

the sense amplifier is run to enhance the above-noted potential difference;

the transfer gate $TR_1$ is turned ON to deliver the potential difference to all bit lines at the cell array unit $a_1$;

the potential of the word lines at the cell array unit $a_1$ is raised; and, the data at the above-noted memory cell is transferred to all memory cell units belonging to the word lines.

These sequential operations are advantageous for all the word lines at the cell array units $a_0$ and $a_1$, since processing can be carried out in a memory chip and it is not necessary to implement a processing such that data is once read out externally and then written in a cell array unit $a_1$.

As the memory shown in FIG. 2 can be utilized as two memories, i.e., dynamically divided into two memories, and the cell array which is not the object for access may be utilized as a stack, an extremely versatile utilization can be expected.

Figure 3:
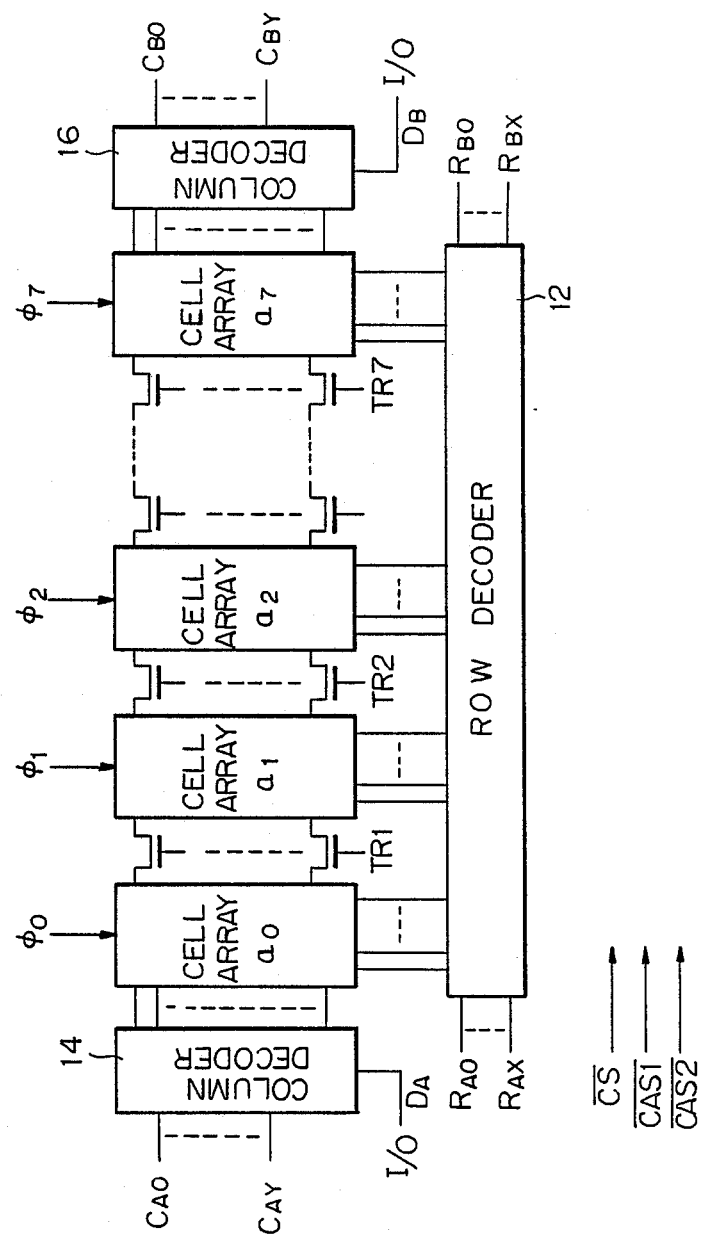
FIG. 3 is a block diagram showing an embodiment of the present invention.

FIG. 3 is a block diagram showing an embodiment of the present invention.

FIG. 3 shows an embodiment in which a cell array is partitioned into eight cell array units. Transfer gates $TR_1$ to $TR_7$ are connected between each cell array unit and based on the ON or OFF of these transfer gates, the multifarious two divisions are obtained; that is, ---
$a_0$: $a_1, a_2, \ldots a_7$
$a_0$ and $a_1$: $a_2, a_3, \ldots a_7$
$a_0$ and $a_1$ and $a_2$: $a_3, a_4, \ldots a_7$
.
.
.
$a_0$ and $a_1$ and $\ldots a_6$: $a_7$
---

These combination of sets of the cell array units could be applied to the above-noted third type memory to the effect that the cell array units $a_0$ and $a_7$ are the accessing objects and the cell array units $a_1$ to $a_6$ are the non-accessing objects. In this case, the cell array units $a_1, a_2, \ldots$ can be dealt as stacks having nest depth $1, 2, \ldots$, and in such usage, it is possible that the newest data save order is a first $a_1$ and a second $a_2, \ldots$.

In FIG. 3, $\phi_0$ to $\phi_7$ are activated clocks of the sense amplifiers in each cell array unit, $RA_0$ to $RA_x$ row addresses of the cell array units at the left side, $RB_0$ to $RB_x$ row addresses of cell array units at the right side, $CA_0$ to $CA_y$ column addresses of the cell array units at the left side, and $CB_0$ to $CB_y$ at the right side.

Figure 6:
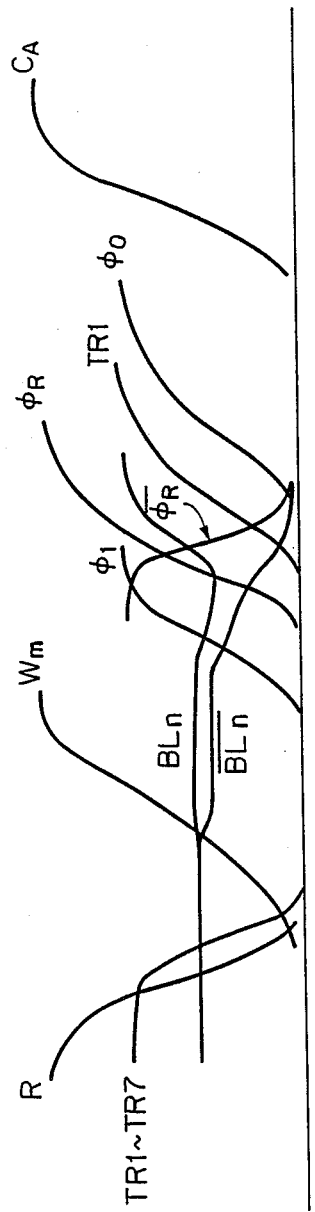
FIG. 6 is a waveform diagram for describing the operation of FIG. 4.

One of the selective cells exists in the cell array unit $a_1$. FIG. 3 shows the passage when the selective cell is read at the left side and FIG. 6 shows the waveforms of each part. The memory cell $MC_a$ which exists at the intersection with bit lines $BL_n$ and word lines $W_m$ is the above-noted selective cell. The selective cell is precharged before reading, because it is intended that the transfer gates $TR_1$ to $TR_7$ are turned ON and a reset signal R is at a high (H) potential level to precharge the selective cell. When the reset signal R is at an H potential level, transistors $Q_1$ and $Q_2$ are turned ON to charge the bit lines $BL_n$ and $\overline{BL_n}$ to a potential of $V_{CC/2}$.

Before reading a reset signal, R is at a low (L) potential level, and transfer gates $TR_1$ to $TR_7$ are turned OFF, then a word line $W_m$ is at an H potential level Then, a memory cell $MC_a$ offers a change of potential. That is, since a capacitor $C_2$ in the memory cell $MC_a$ is being charged to a potential of $V_{CC}$ or $V_{SS}$, a bit line $BL_m$ is raised to the voltage $V_{CC}$ and at the voltage $V_{SS}$ the potential of the bit line $\overline{BL_m}$ is reduced, thus there is a potential difference between the potential of bit lines $BL_m$ and $\overline{BL_m}$.

Then a clock $\phi_1$ is raised to make the sense amplifier $SA_1$ active and the above-described potential difference between $BL_n$ and $\overline{BL_n}$ is enlarged. Then, when the transfer gate $TR_1$ is ON, a potential difference occurs between bit lines $BL_m$ and $\overline{BL_m}$ of the cell array unit $a_0$. Further, the potential of a clock $\phi_0$ is raised to make the sense amplifier $SA_0$ active and the potential difference is enlarged. Thereafter, an active restorer ART is operated to pull-up the bit lines $BL_m$ or $\overline{BL_m}$ at the H side to the voltage $VC_C$.

The bit lines at the L side are pulled down by the sense amplifiers $SA_0$ and $SA_1$ to the voltage $V_{SS}$. As a result, the potential difference of $V_{CC}$ (generally, $V_{SS}$ =0 V) is applied to the bit lines $BL_m$ and $\overline{BL_m}$, and at this stage, the output $C_A$ of a column decoder makes the column gate $CG_A$ ON, and thereby the bit lines $\overline{BL_m}$ and $BL_m$ are connected to the data buses $D_A$ and $\overline{D_A}$.

With respect to the memory, the row address and column address which access the left cell array and the right cell array may be input through each separate terminal pin, or a common terminal pin may be used in accordance with a time division system. For example, separate inputs $RA_0$ to $RA_x$ and $R_{B0}$ to $R_{Bx}$ of the row decoder 12 and separates inputs $C_{A0}$ to $C_{Ay}$ and $C_{B0}$ to $C_{By}$ of the column decoders 14, 16 may be input in sequence in the above-described order, and these input may be taken to each terminal pin. The row address includes the selective bits for blocks (that is, cell array units $a_0, a_1, \ldots$). In this case, since the block number is eight, as shown in FIG. 3, the higher ranked three bits of the row address are used for a block selection, and the residual bits are used for a selection of word lines in the block.

Whether data is read to the left side or to the right side depends on the relative location of the two memory cells which are accessed simultaneously. For example, if a memory cell $MC_1$ lies in the area of the cell array unit $a_0$ and a memory cell $MC_2$ is in the area of the cell array unit $a_1$, the memory cell $MC_1$ can be read to the left side and the memory cell $MC_2$ to the right side. Further, if the memory cell $MC_1$ is in the area of the cell array unit $a_2$, and the memory cell $MC_2$ is in the area of the cell array unit $a_1$, the memory cell $MC_1$ can be read to the right side and the memory cell $MC_2$ to the left side. That is, where the higher ranked three bits of the row address in the two selective cells are ROW1 and ROW2, and the column addresses are COL1 and COL2, if ROW1˚ROW2, then $C_A$=COL1, $C_B$=COL2; if ROW1>ROW2, then $C_A$=COL2, $C_B$=COL2.

At the same time the memory cells of the same cell array can be accessed. In this case, if the priority order is determined previously, and if ROW1=ROW2, then $C_A$=COL1 or the like. In this memory, there is provided a control circuit (not shown in the figure) which carries out an ON-OFF control for each transfer gate in accordance with the above-described read direction to the left or right side, the priority processing, and the input address or the like.

Figure 4:
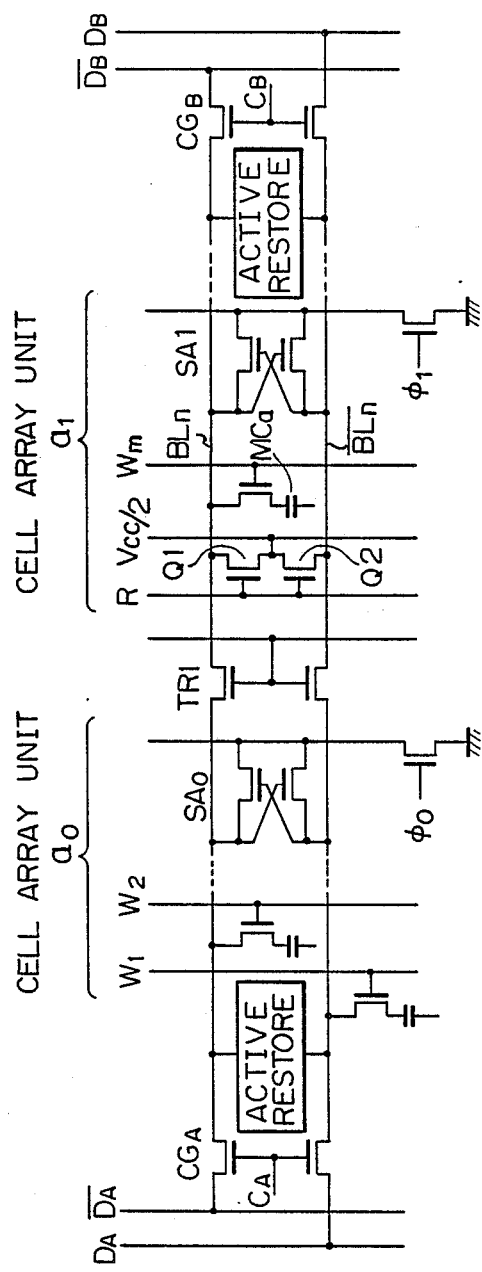
FIG. 4 is a circuit diagram for explaining the read mode of a memory cell according to the present invention.
Figure 5:
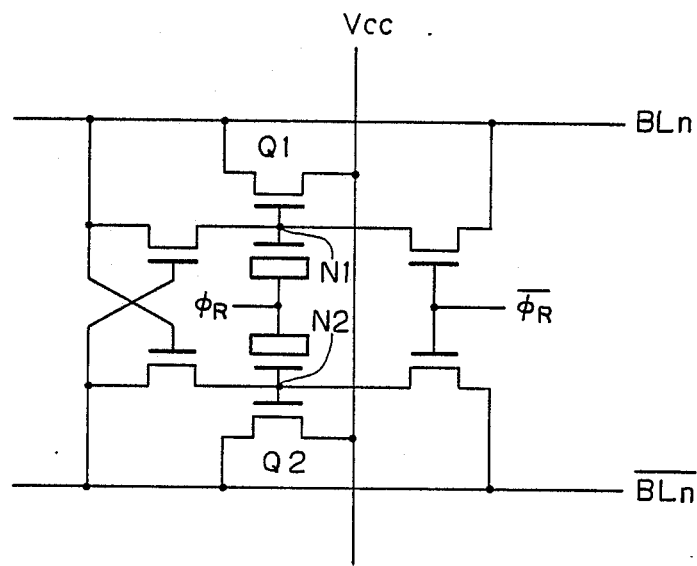
FIG. 5 is a circuit diagram of an active restorer circuit in FIG. 4.

FIG. 5 is a circuit of active restore as shown in FIG. 4. As the potential $\phi_R$ raises, only the bit line side at the high potential level side between the nodes $N_1$ and $N_2$ is raised up to a potential level higher than the voltage $V_{CC}$ by a capacitive coupling. When the transistor $Q_1$ or $Q_2$ is turned ON fully, the potential level $V_{CC}$ is supplied to the bit line at the high potential level side from the $V_{CC}$ line. The waveforms of the potential $\phi_R$ and $\overline{\phi_R}$ are shown in FIG. 6.

Referring to FIGS. 3 to 5, the waveforms of $TR_1$ to $TR_7$, R (reset signal), Wm (word line), $\phi_0$ and $\phi_1$ (clock signal), $\phi_R$ and $\overline{\phi_R}$ (potential of the active restore circuit), and $C_A$ (column selection signal) are compared as shown in FIG. 6.

Figure 7:
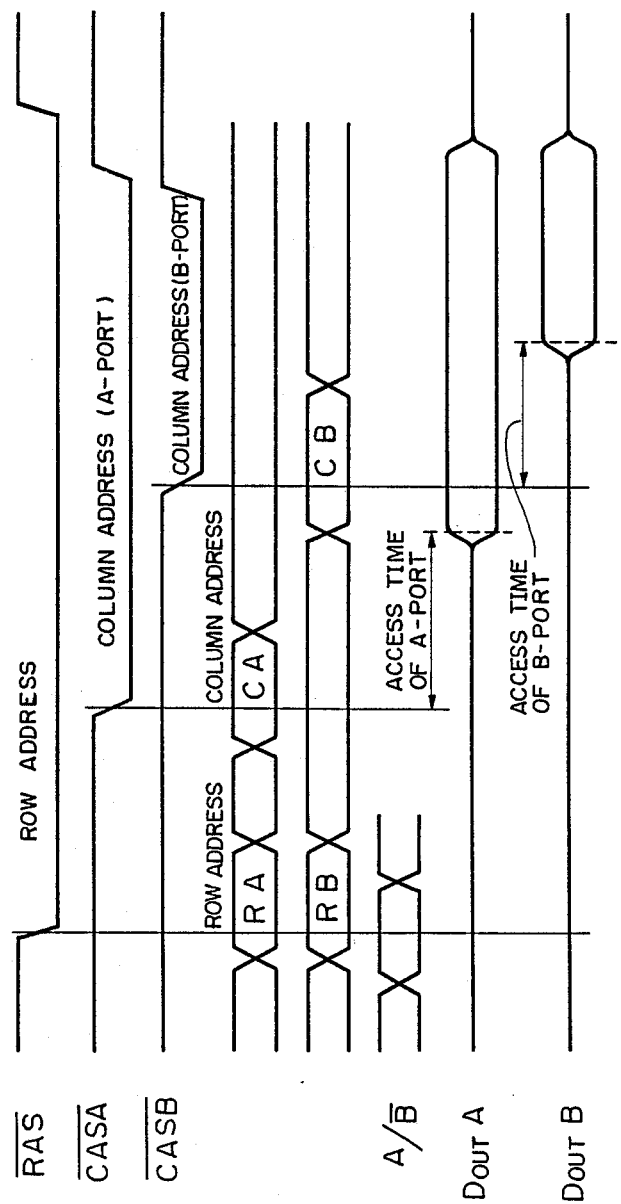
FIG. 7 is a waveform diagram showing the relationship between the row address and column addresses.

FIG. 7 is a waveform diagram of arbitration operation in accordance with the present invention. FIG. 7 shows the waveform on reading in the memory cell. The same waveform is obtained on writing in the memory cell. In the figure, RAS is an A-port row address, CASA an A-port column address, CASB a B-port column address, RA an A-port row address, RB a B-port row address, CA an A-port column address, CB a B-port column address. An A-port output $D_{OUT}A$ is output from the variation point from H to L level after an access time of A-port and a B-port output $D_{OUT}B$ from the variation point from H to L level after an access time of B-port. The arbitration signal $A/\overline{B}$ offers an H level in case of an A-port priority and L level in case of a B-port priority. By means of the arbitration signal the solution of competition between the A-port and B-port row addresses and column addresses is obtained.

FIG. 8 is a block diagram of an alternative embodiment of the present invention. In the figure, $AA_0$ to $AA_m$ are A-port input addresses, $BA_0$ to $BA_m$ B-port input addresses, $Ar_0$ to $Ar_m$ A-port row latch addresses, $Br_0$ to $Br_m$ B-port row latch addresses $Ac_0$ to $Ac_m$ A-port column latch addresses, $Bc_0$ to $Bc_m$ B-port column latch addresses, $TR_1$ to $TR_3$ transfer gate control signals and $SEL_0$ to $SEL_3$ decoder control signals, respectively. If the decoder of A-port is active, an H level is offered and if the decoder of B-port is active, an L level is offered, as shown on $D_{OUT}A$ and $D_{OUT}B$ in FIG. 7.

Figure 9:
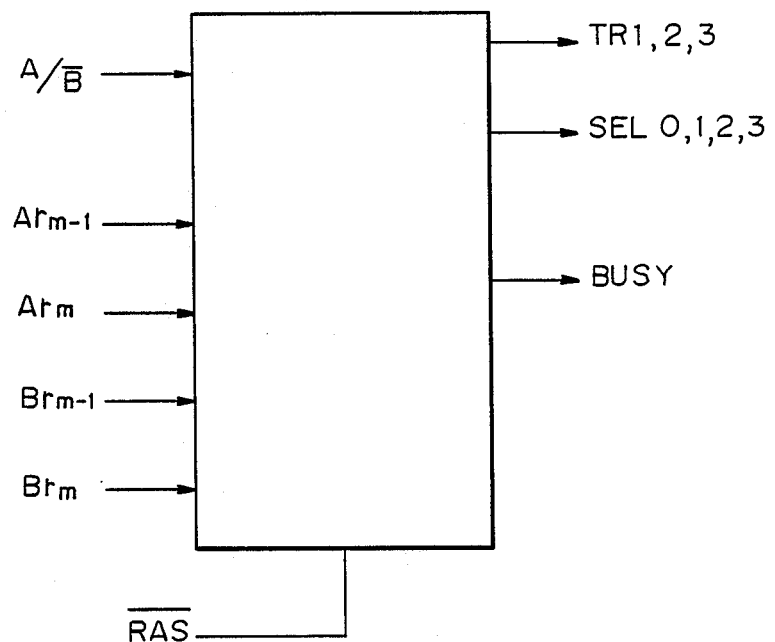
FIG. 9 is a terminal connection between the arbitrary inputs vs. outputs.

FIG. 9 is a schematic diagram of a terminal connection for the signal for arbitration.

As shown in FIG. 8, an alternative embodiment in which the memory cell is partitioned into four cell array units. In this case, the selection of the array units is carried out by means of 2 bits in the row address. In FIG. 9, the inputs are composed of $A/\overline{B}$, $Ar_{m-1}$, $Ar_m$, $Br_{m-1}$ and $Br_m$ The outputs are $TR_1$ to $TR_3$, $SEL_0$ to $SEL_3$ and BUSY signal. Therefore, the relationship between the transfer gates TR to $TR_3$ and the decoder selection signals $SEL_0$ to $SEL_3$ is determined by a logic table in FIG. 10. If the arbitration $A/\overline{B}=H$, $r_m$ and $r_{m-1}$ is determined by the higher ranked 2 bits in the A-port row addresses, and if the arbitration $A/\overline{B}=L$, $r_m$ and $r_{m-1}$ is determined by the high ranked 2 bits in the B-port row addresses.

With respect to Busy control, if the arbitration $A\overline{B}=H$ and $Ar_m$, $Ar_{m-1} >= Br_{m-1}$, $Br_m$, then a Busy signal is output. If the arbitration $A/\overline{B}=L$ and $Ar_{m-1}$, $Ar_m \leq Br_{m-1}$, $Br_m$, then a Busy signal is output. In this case, when the arbitration $A/\overline{B}=H$, the A-port is prioritized and when the arbitration $A/\overline{B}=L$, the B-port is prioritized.

Figure 11:
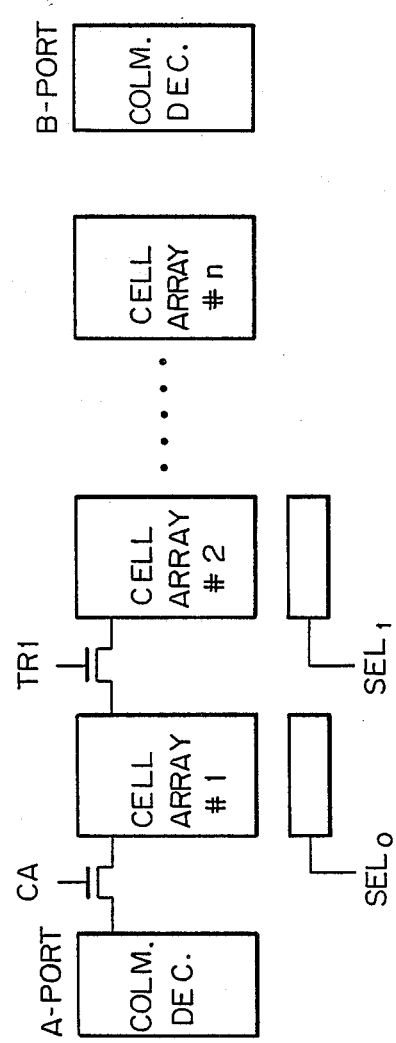
FIG. 11 is a functional diagram showing the buffer operation of the cell arrays at both ends.
Figure 12:
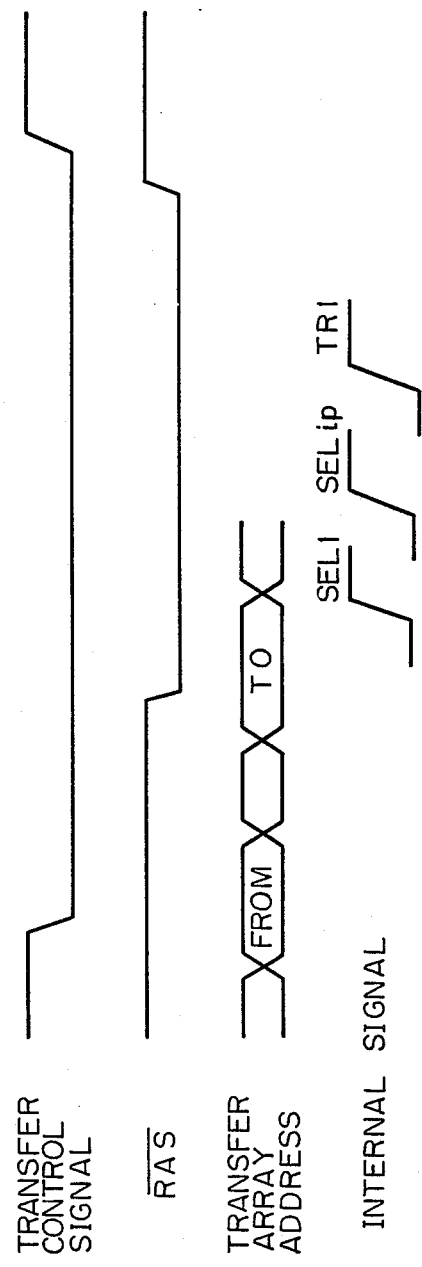
FIG. 12 is a waveform diagram showing the relationship between the transfer control signal and internal signals.

FIG. 11 is a schematic diagram showing a still further embodiment of the present invention. In FIG. 11, with respect to the A-port and B-port, an adjacent cell array unit #1 to the A-port column decoder and an adjacent cell array unit #n to the B-port column decoder are used as a buffer. Data is transferred between each other cell array unit by a row unit. In this case, it is only a cell array unit #1 that the A-port can access data directly, and it is only a cell array unit #n that the B-port can access data directly. Therefore, the data between the array unit #2 to the array unit #n−1 can be accessed by the data transfer between each cell array unit, after the transfer to the array unit #1 or #n has been complished.

The dual access is the same as the prior example and is of a $\overline{RAS}$ synchronization type. In case of the internal transfer where the transfer is carried out from, the process is implemented as follows:

(a) The operation state of the device is determined by the transfer control signal.

(b) The addresses of the transfer originator and the transfer object, that is, the array unit selection addresses, are latched by means of the transfer control signal and $\overline{RAS}$ (row address).

(c) The row decoder of the cell array in the transfer originator is made activated to latch by the same amplifiers in the array units.

(d) The row decoder of the cell array in the transfer object is made activated.

(e) The transfer gate $TR_1$ is turned ON.

(f) The data signal is amplified by a sense amplifier of the cell array unit in the transfer object and the data of the transfer object is destructed and the data of the transfer originator is latched.

We claim:

1. A semiconductor memory device comprising:
a memory cell array constituted by a plurality of memory cell array units;
transfer gates inserted in bit lines between the adjacent memory cell array units;
a first and a second column decoders connected to both ends of bit lines in which said transfer gates are inserted; and
a row decoder connected to word lines of said memory cell array;
said row decoder being adapted to be divided operatively in two;
two sets of row/column addresses being supplied to said column decoders and said row decoder;
whereby simultaneous separate accesses to said memory cell array are carried out by said two sets of row/column addresses.

2. A semiconductor memory device as set forth in claim 1, wherein there is provided a cell array which is divided into at least more than three cell array units and is selectively partitioned, through transfer gates, into two sets of a left side portion and a right side portion and three sets of a left end portion, a right end portion and an intermediate portion.

3. A semiconductor memory device according to claim 1, wherein the cell array units at both ends are adapted to operate as a buffer and data is transferred between said cell array units based on the row unit.

4. A semiconductor memory device comprising:
a memory cell array constituted by a plurality of memory cell array units;
transfer gates inserted in bit lines between the adjacent memory cell array units;
a first and a second column decoders connected to both ends of bit lines in which said transfer gates are inserted;
a row decoder connected to word lines of said memory cell arrays;
said row decoder being adapted to be divided selectively into two parts;
a first-port and a second-port row address buffers for inputting a first port and a second port input addresses, respectively;
a first-port and a second-port column address buffer for delivering a separate column latch address; wherein there is provided arbitrary terminals in which, when said first port and said second port access the same memory cell array unit separately, either of the two ports can be operated to arrange according to priority.

5. A semiconductor memory device according to claim 4, wherein a BUSY output terminal is provided and when received the same array access, a BUSY signal is output for a low rank priority port.

6. A semiconductor memory device comprising:
a memory cell array constituted by an even number of plural memory cell array units;
transfer gates inserted in bit lines between the adjacent memory cell array units;

a first and a second column decoders connected to both ends of bit lines in which said transfer gates are inserted, both column decoders being input by column addresses from both ends; and a row decoder connected to word lines of said memory cell array, said row decoder being input by row addresses from both ends and said row decoder being adapted to be partitioned selectively into two parts; wherein it is a respective nearest array unit to each port from both ends that said two ports can make a direct access and array units other than said nearest array units can be served as a stack.

7. A semiconductor memory device according to claim 6 wherein data transfer can be carried out between said cell array units which are possible to make a direct access and the stack cell array units, not by external accessing, but by controlling in the inner portion of said device.

8. A semiconductor memory device according to claim 6, wherein data transfer can be carried out in addition to a refresh operation of said memory cell array units.

* * * * *

UNITED STATES PATENT AND TRADEMARK OFFICE
CERTIFICATE OF CORRECTION

PATENT NO. : 4,819,209

DATED : April 4, 1989

INVENTOR(S) : Yoshihiro TAKEMAE et al.

Figure 8B:
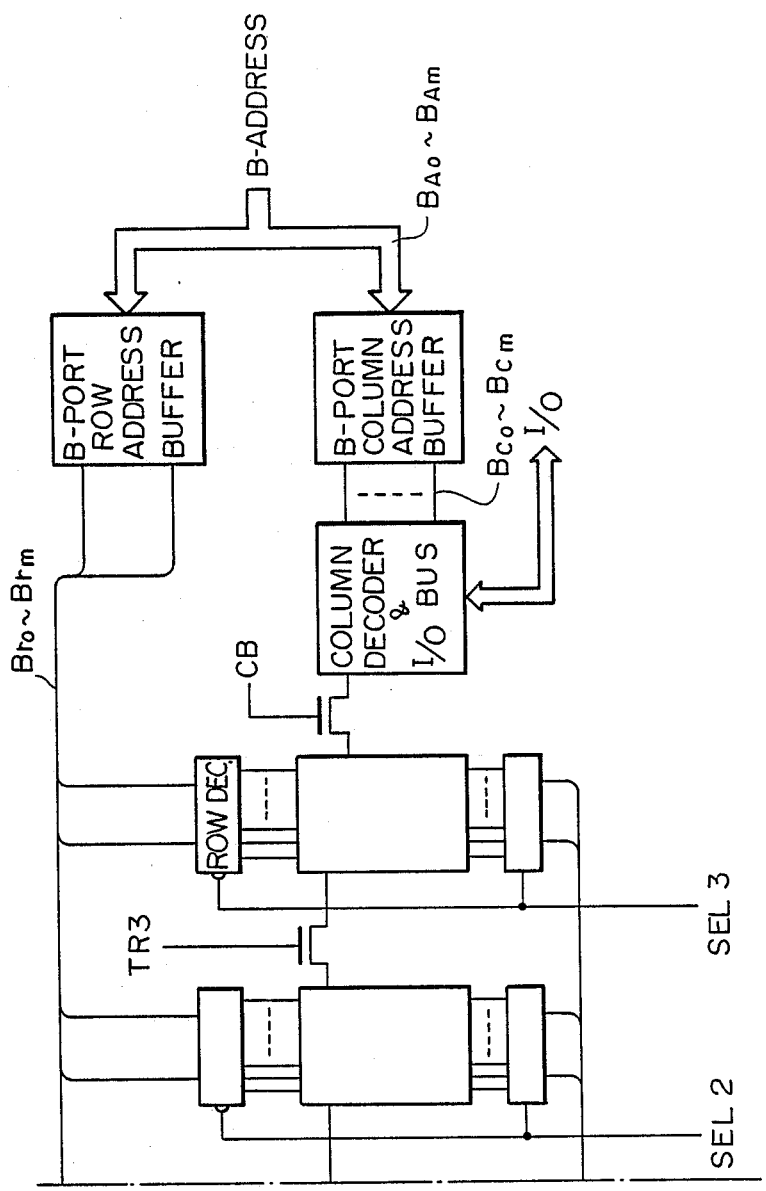

It is certified that error appears in the above-identified patent and that said Letters Patent is hereby corrected as shown below:

Col. 2, line 58, delete "FIGS. 8 and 8A-B are block diagrams" and insert --FIGS. 8A and 8B together are a block diagram--.

Col. 6, line 34, delete "°" and insert --<--.

Col. 7, line 29, delete "TRto" and insert --$TR_1$ to--;

line 55, delete "complished" and insert --accomplished--.

Signed and Sealed this

Twenty-fourth Day of October, 1989

Attest:

DONALD J. QUIGG

*Attesting Officer*  *Commissioner of Patents and Trademarks*